United States Patent
Nandy (10) Patent No.: US 7,436,235 B2
(45) Date of Patent: Oct. 14, 2008

(54) DIGITAL CLOCK MODULATOR

(75) Inventor: Tapas Nandy, Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 691 days.

(21) Appl. No.: 10/909,939

(22) Filed: Aug. 2, 2004

(65) Prior Publication Data

US 2005/0063503 A1 Mar. 24, 2005

(30) Foreign Application Priority Data

Jul. 31, 2003 (IN) .......................... 949/DEL/2003

(51) Int. Cl.
*G06F 1/04* (2006.01)

(52) U.S. Cl. .................. 327/291; 327/176; 327/262; 327/277

(58) Field of Classification Search .......... 327/172–176, 327/291–298, 261–264, 269–272, 276–278
See application file for complete search history.

(56) References Cited

U.S. PATENT DOCUMENTS

| | | | | |
|---|---|---|---|---|
| 5,442,664 | A | | 8/1995 | Rust et al. .................. 375/371 |
| 5,699,005 | A | | 12/1997 | Menkhoff et al. ............ 327/292 |
| 5,796,673 | A | | 8/1998 | Foss et al. ................... 365/233 |
| 5,945,862 | A | * | 8/1999 | Donnelly et al. ............ 327/278 |
| 5,955,907 | A | * | 9/1999 | Niijima ....................... 327/262 |
| 6,169,436 | B1 | | 1/2001 | Marbot ........................ 327/270 |
| 6,351,485 | B1 | | 2/2002 | Soe et al. .................... 375/130 |
| 6,366,174 | B1 | | 4/2002 | Berry et al. ................... 331/78 |
| 6,373,306 | B1 | | 4/2002 | Mann et al. .................. 327/159 |
| 6,518,813 | B1 | * | 2/2003 | Usui ........................... 327/291 |
| 7,061,293 | B2 | * | 6/2006 | Fukushima ................. 327/291 |
| 2001/0045857 | A1 | | 11/2001 | Nunokawa et al. .......... 327/277 |

OTHER PUBLICATIONS

Hardin et al., Spread Spectrum Clock Generation for the Reduction of Radiated Emissions.

* cited by examiner

*Primary Examiner*—N. Drew Richards
*Assistant Examiner*—William Hernandez
(74) *Attorney, Agent, or Firm*—Lisa K. Jorgenson; Allen, Dyer, Doppelt, Milbrath & Gilchrist (57) ABSTRACT

A digital clock modulator provides a smoothly modulated clock period to reduce emitted electro-magnetic radiation (EMR). The digital clock modulator includes a plurality of delay elements connected in series and receiving as an input an unmodulated clock signal. A multiplexer receives inputs from unequally spaced taps between the delay elements. A control block provides selection inputs to the multiplexer, and receives the unmodulated clock signal from the delay elements. The delay elements include a last delay element providing the unmodulated clock signal to the control block. The last delay element has a predetermined delay for ensuring that the delay elements and related signal paths are in a same stable state before control to the multiplexer changes.

22 Claims, 7 Drawing Sheets

DIGITAL CLOCK MODULATOR

FIELD OF THE INVENTION

The invention relates to an improved digital clock modulator providing a smoothly modulated clock period for reducing amplitude of electro-magnetic radiations (EMR) emitted during clock transitions.

BACKGROUND OF THE INVENTION

Electro-magnetic radiations (EMR) emitted by higher harmonics of a basic clock frequency of a digital circuit due to the activities at the clock edges significantly effect the normal operation of neighboring, circuits. To prevent the adverse effects of such EMR the amplitude of the emitted radiations should be kept to a minimum. Various methods have been adopted for reducing the amplitude of interfering radiations. For example, the phase/frequency of the basic clock frequency is modulated for spreading the emitted radiation frequency band for distributing the radiating energy into adjacent side-bands about each harmonic frequency. Consequently, this reduces the amplitude of higher harmonic frequencies.

Frequency modulation is a predominantly analog technique and has overheads in terms of implementations in the integrated circuit (IC). Moreover, any arbitrary modulation does not generate an optimum EMI reduction. In other words, randomly modulating a clock generating source may not provide improved attenuation of EMI. A proper selection of the modulation is essential to ensure its effectiveness in reducing EMR. Reference is directed to Spread Spectrum Clock Generation for the Reduction of Radiated Emissions, Hardin et al., IEEE International Symposium on Electromagnetic Compatibility, 22-26 Aug., 1994. U.S. Pat. Nos. 6,366,174; 6,373,306; and 6,351,485 propose the use of PLLs for reducing EMR. However, these techniques cannot be used for systems in which the PLL is a procured object, that is, one which cannot be modified.

Figure 1:
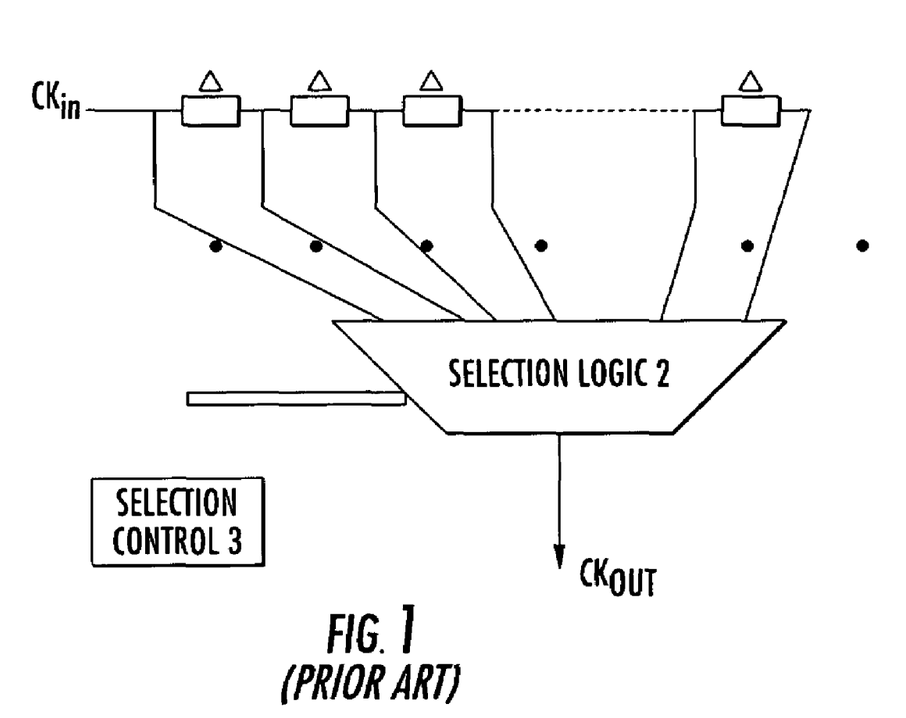
FIG. 1 shows a digital clock period modulator in accordance with the prior art.

Prior art digital modulation of the clock period, as disclosed in U.S. Pat. No. 5,442,664 for example, proposes the use of 'n' number of delay components of equal delay $\Delta$, as shown in FIG. 1. Selection control 3 (up/down counter of n-states) uses delay tap selection logic 2 to modulate the time period of the clock. It makes the clock period ($T_{ck}+\Delta$) for the first 'n' clock cycles and ($T_{ck}-\Delta$) for the next 'n' clock cycles alternating in this manner continuously. This technique does not provide optimum spread spectrum EMR reduction since the energy concentrates around two frequencies: $1/(T_{ck}+\Delta)$ and $1/(T_{ck}-\Delta)$ only.

U.S. Patent Publication No. 20010045857 proposes a similar scheme, differing only in that it provides a technique to adjust ($\Delta/T_{ck}$) by adjusting the supply voltage to the delay units. This technique is not suitable for most integrated digital systems since it calls for varying the supply voltage.

U.S. Pat. No. 5,699,005 proposes a technique utilizing both equal delay and unequal delays in the delay chain block, but effectively the successive increment (decrement) of the delay in the delay chain are always constant ($\Delta$). The main difference lies in the way the switching of the delay taps onto the clock output is performed. Here, the delay tap selection is done using a pseudo-random number sequence, which causes radiation energy spectrum to be better distributed as compared to the previous techniques. However, the pseudo-random nature results in a sharp odd time period variation while other time periods are very slow. This results in the concentration of the radiated frequency around certain frequencies instead of spreading as evenly as possible.

SUMMARY OF THE INVENTION

An object of the invention is to address the above drawbacks of the prior art with respect to providing an even distribution of the radiated emissions in digital clock circuits.

Another object of the invention is to provide a technique for the smooth digital modulation of clock periods.

Yet another object of the invention is to provide a finely distributed clock energy spectrum for reducing the amplitude of the EMR, with smaller peak-to-peak variations of the clock period (i.e., a smaller modulation index) over a large number of clock cycles (i.e., a slower modulating frequency).

A further object of the invention is to provide a flexible design capable of producing any desired clock-period modulating pattern (i.e., modulating waveform).

These and other objects of the invention are achieved by an improved digital clock modulator for providing a smoothly modulated clock period to reduce emitted electro-magnetic radiation (EMR), wherein the digital clock modulator comprises a plurality of delay elements connected in series receiving an unmodulated clock signal at an input thereof, a multiplexer receiving inputs from unequally spaced selected taps provided between the delay elements, and a control block supplying the selection-inputs to the multiplexer, and receiving a clock signal from the series of delay elements. A predetermined delay element is connected between the clock terminal of the control block and the last element of the series of delay elements for enabling glitch free operation by ensuring that the entire delay chain and related signal paths are in the same stable state before the control to the multiplexer changes.

The taps may be provided in accordance with the modulation of the clock period. The control block may include up/down counting means for sequentially selecting the taps in the delay chain so that the difference in delays of the input to output clock increases consecutively for consecutive clock cycles for one half of the modulating period, and then reduces in a similar manner for the second half of the modulating period. The taps are spaced further apart from each other in the middle of the clock chain, and are spaced closer together at the two ends of the chain.

The invention further includes a delay interpolation mechanism for providing a finer resolution of the clock modulation over a larger number of clock cycles. The delay interpolation mechanism may comprise a pair of multiplexers replacing the single multiplexer with alternate taps of the delay chain connected to each multiplexer, and a chain of series connected PMOS-NMOS transistor pairs that are sized such that their channel-length-to-channel-width ratios increase in a binary weighted sequence, and are connected to the output of each multiplexer. A control circuit generates complementary control signals for enabling the series connected PMOS-NMOS transistor pairs in a desired sequence.

The code for multiplexer selection may be a monotonically increasing code for increasing clock modulation depth, whereas the code for delay interpolation may increase or decrease for alternate codes for the multiplexer.

The modulating waveform may be selected by sequencing the delay selection code and the delay interpolator code to provide consecutively increasing delays and differences in the delays in the clock path for consecutive clock cycles over one half of modulating period followed by similarly decreasing delays and differences in the delays for the second half of the modulating period.

The present invention further provides a method for reducing emitted EMR from digital clock circuits by smoothly modulating the clock period. The method comprises the steps of connecting a plurality of delay elements in series and supplying an unmodulated clock signal at the input of the first delay element, multiplexing selected outputs obtained from selected taps in the chain of delay elements, and delaying the clock to the last element of the delay chain suitably with respect to the multiplexing for enabling glitch free operation.

The taps for multiplexing may be selected based on the desired modulating wave.

The method may further comprise selecting the consecutively increasing delays and differences in the delays in the clock delay path in consecutive clock cycles up to a maximum allowed delay, for one half of the modulating wave's period, and then reducing the delays similarly for the second half of the modulating period.

The method may further include delaying the clock of the control block to ensure that the entire delay chain and other concerned signal paths are in the same stable logical state (0 or 1) before the control to the multiplexer changes.

The predetermined delay may be determined for unmodulated clock cycles as follows:

$$\sum u(i) \cdot \Delta + T_{mux} + T_{del} + T_{CK \to Sel} < T_{HLmin}$$

where:

$T_{mux}$ is the maximum input to output delay of the multiplexer;
$T_{CK \to SEL}$ is the clock to output delay of the control block;
$T_{HLmin}$ is the minimum of the high or low phase of the unmodulated clock cycle;
$T_{del}$ is the delay to be provided; and
$\sum u(i) \cdot \Delta$ is the total delay of the series of delay elements.

The method may further include a delay interpolator for providing a finer resolution of the clock modulation. The delay interpolator may comprise the steps of multiplexing alternate taps of the delay chain separately, connecting a chain of series PMOS-NMOS transistor pairs that are sized such that their channel-length-to-channel-width ratios increase in a binary weighted sequence, and generating complementary control signals for enabling the series connected PMOS-NMOS transistor pairs to operate in a desired sequence.

The method for reducing emitted EMR from digital circuits may be performed by monotonically increasing the code for multiplexer selection for increasing clock modulation depth, and increasing or decreasing the code for delay interpolation for alternate codes for the multiplexer.

BRIEF DESCRIPTION OF THE DRAWINGS

The invention will now be described with reference to the accompanying drawings.

DETAILED DESCRIPTION OF THE PREFERRED EMBODIMENTS

The circuit of the present invention is based upon manifestation of the following mathematical analysis. Time Period modulation and its spectral representation will initially be discussed.

Figure 2:
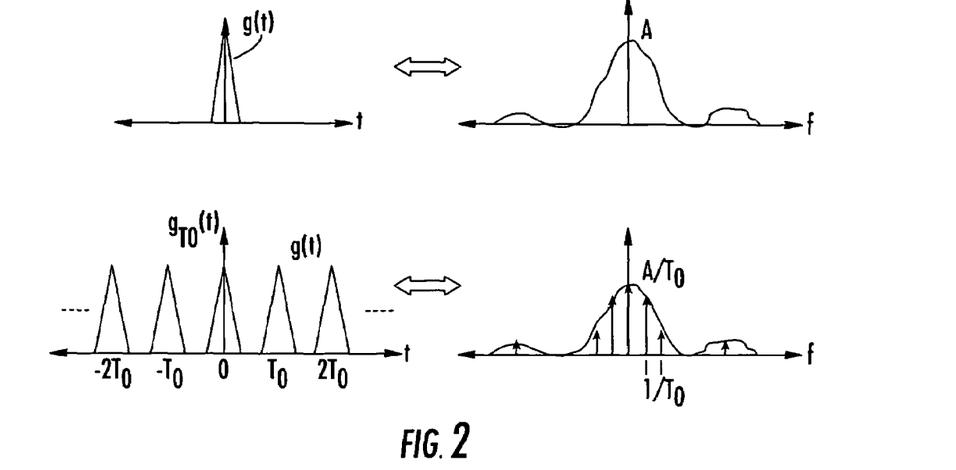
FIG. 2 shows arbitrary time functions and their representation in the frequency domain in accordance with the present invention.

An arbitrary time dependent signal g(t) occurring in the time period $T_0$ can be represented in the frequency domain by its Fourier transform G(f). It can be switching current spikes, for example. FIG. 2 shows such an arbitrary time dependent signal g(t) and its frequency domain representation G(f). The Fourier Transform is given by equation (1):

$$g(t) \Leftrightarrow G(f) \qquad (1)$$

If g(t) repeats every $T_0$, as shown in FIG. 2, then $g_{T0}(t)$ in the frequency domain would be represented by equation (2):

$$g_{T0}(t) \Leftrightarrow \frac{1}{T_0} \cdot \sum_{m=-\infty}^{+\infty} G\left(\frac{m}{T_0}\right) \cdot \delta\left(f - \frac{m}{T_0}\right) \qquad (2)$$

where, the Dirac deltas $$\delta\left(f - \frac{m}{T_0}\right)$$

are the discrete frequency components in the frequency domain occurring at harmonics of frequency ($1/T_0$). The amplitude is scaled by $1/T_0$ over the same Fourier transform function G(f) of equation (1).

Figure 3:
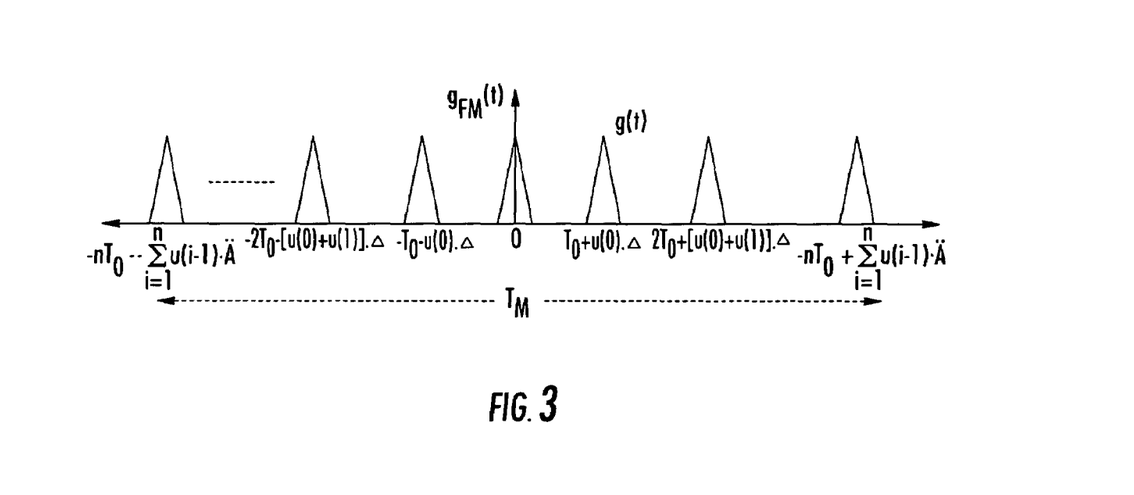
FIG. 3 shows a system time period modulation over one modulating period $T_M$ in accordance with the present invention.

Consider a time dependent function which repeats over a varying time period ($T_0 + u(i) \cdot \Delta$) with a pattern repeating over a period $T_M$ as shown in FIG. 3. $T_M$ is the period of the modulating wave and u(i) is the effective modulating function on an unmodulated time period $T_0$. The period $T_M$ is given by equation (3):

$$T_M = 2T_0 \cdot \left[n + \sum_{i=1}^{n} u(i-1) \cdot \frac{\Delta}{T_0}\right] \qquad (3)$$

The Fourier Transform of the activity over one period of $T_M$, as shown in FIG. 3, is given by the following equation (4) after using the time shift property of the Fourier Transform:

$$g_{FM}(t) \Leftrightarrow G(f) \cdot \left[1 + \sum_{l=1}^{n}\left[\exp\left\{-j2\pi fT_0\left(l + \sum_{i=1}^{l} u(i-1) \cdot \frac{\Delta}{T_0}\right)\right\} + \exp\left\{+j2\pi fT_0\left(l + \sum_{i=1}^{l} u(i-1) \cdot \frac{\Delta}{T_0}\right)\right\}\right]\right] \therefore \quad (4)$$

$$g_{FM}(t) \Leftrightarrow G(f) \cdot \left[1 + \sum_{l=1}^{n} 2 \cdot \cos\left\{2\pi fT_0\left(l + \sum_{i=1}^{l} u(i-1) \cdot \frac{\Delta}{T_0}\right)\right\}\right]$$

The function $g_{FM\_TM}(t)$ is actually a function $g_{FM}(t)$ repeating after every $T_M$ period. Applying equations (1) and (2) on (4) we get the following equation (5):

$$g_{FM\_T0}(t) \Leftrightarrow \frac{1}{T_M}\sum_{m=-\infty}^{\infty}\left(G\left(\frac{m}{T_M}\right) \cdot \left[1 + \sum_{l=1}^{n} 2 \cdot \cos\left\{2\pi\left(\frac{m}{T_M}\right)T_0\left(l + \sum_{i=1}^{l} u(i-1) \cdot \frac{\Delta}{T_0}\right)\right\}\right] \cdot \delta\left(f - \frac{m}{T_M}\right)\right) \quad (5)$$

On comparing equation (2) and (5), it is seen that after the signal is frequency modulated, discrete frequency components occur at more closely space frequency intervals $$\delta\left(f - \frac{m}{T_M}\right)$$

(since $T_M > T_0$) while providing a spread spectrum effect. It is also observed that a factor $Z(f)$ scales the transform amplitude envelope $G(f)/T_0$ of the unmodulated periodic activity. $Z(f)$ can be written as:

$$Z(f) = \frac{T_0}{T_M}\left[1 + \sum_{l=1}^{n} 2 \cdot \cos\left\{2\pi \cdot (fT_0) \cdot \left(l + \sum_{i=1}^{l} u(i-1) \cdot \frac{\Delta}{T_0}\right)\right\}\right] \quad (6)$$

The following transforms show the effect of frequency modulation (or time period modulation) with different parameters on the system clock. 'x' is substituted for $(fT_0)$, which is the real number multiple (integral and fractional) of the fundamental frequency $(1/T_0)$.

For $\Delta T_0$ the maximum allowed deviation of the time period $T_0$, which is set by the system requirements assuming p is the allowed fractional deviation of $T_0$ by the system, the following equations can be written in terms of the following system specified variables, p, modulating wave, u(i) and n:

$$x = fT_0; \ p = \frac{\Delta T_0}{T_0}; \ \Delta T_0 = u(n-1) \cdot \Delta; \ \frac{\Delta}{T_0} = \frac{p}{u(n-1)}; \ \& \quad (7)$$

$$\frac{T_0}{T_M} = \frac{1}{2\left(n + \frac{p}{u(n-1)}\sum_{i=1}^{n} u(i-1)\right)}$$

Substituting equation (7) in (6) we get an envelope multiplying factor $Z'(x)$:

$$Z'(x) = \frac{1}{2\left(n + \frac{p}{u(n-1)}\sum_{i=1}^{n} u(i-1)\right)}\left[1 + \sum_{l=1}^{n} 2 \cdot \cos\left\{2\pi \cdot x \cdot \left(l + \sum_{i=1}^{l} u(i-1) \cdot \frac{p}{u(n-1)}\right)\right\}\right] \quad (8)$$

Figure 4:
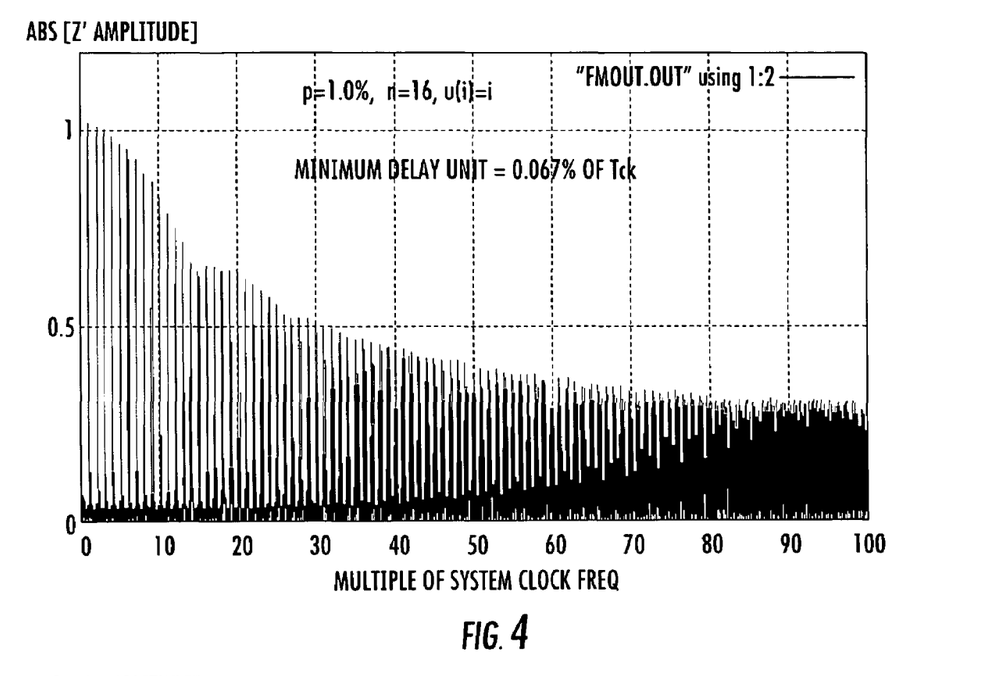
FIG. 4 shows a plot of function Z'(x) for p=1%, n=16 and u(i)=i in accordance with the present invention.
Figure 5:
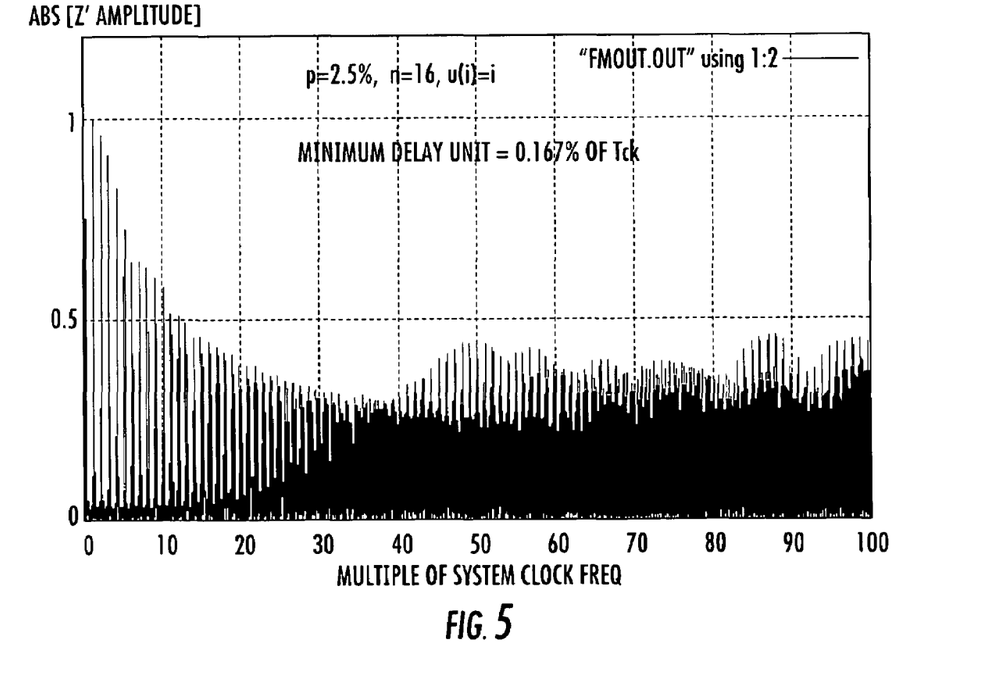
FIG. 5 shows a plot of function Z'(x) for p=2.5%, n=16 and u(i)=i in accordance with the present invention.

On plotting the function $Z'(x)$, the scale factor for the radiation patterns of equation (8) against values of p and n, and keeping u(i) as a linear function, i.e., u(i)=i, we obtain the graphs shown in FIGS. 4, 5, 6 and 7. The graphs clearly show a substantial radiation attenuation of 6 dB (the Y axis value of 0.5 or less) compared to the unmodulated system clock. It is also observed that larger values of p (i.e., a larger deviation of system clock period) for a given value of n (same modulating frequency) give better attenuation. An attenuation of 6 dB is achieved at the $30^{th}$ harmonic of the signal for p=1% and n=16 as shown in FIG. 4, whereas the same result is achieved at the $12^{th}$ harmonic for p=2.5% as shown in FIG. 5.

Figure 6:
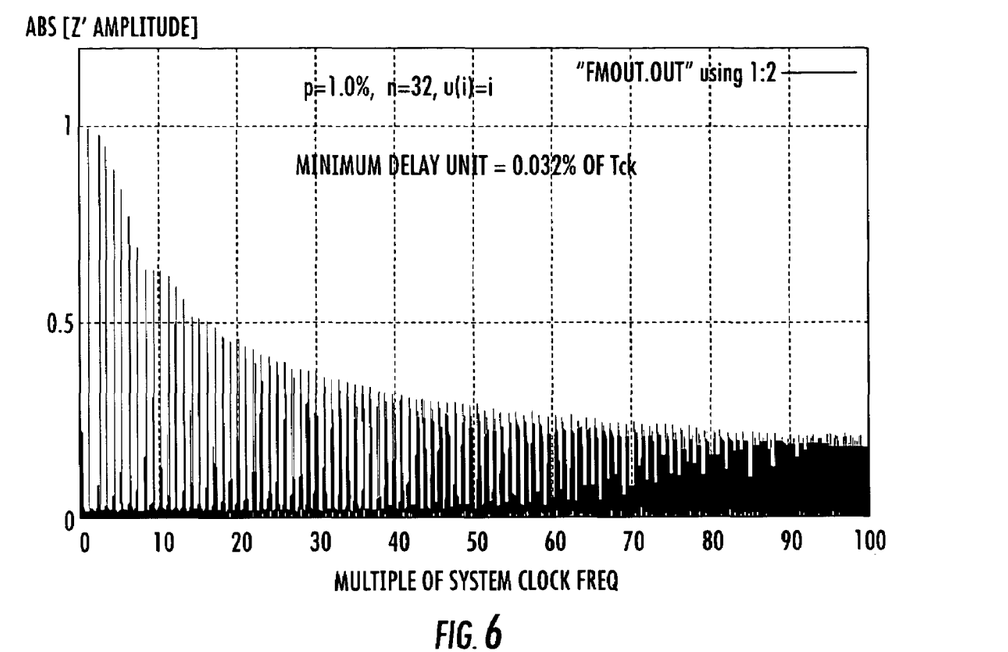
FIG. 6 shows a plot of function Z'(x) for p=1%, n=32 and u(i)=i in accordance with the present invention.
Figure 7:
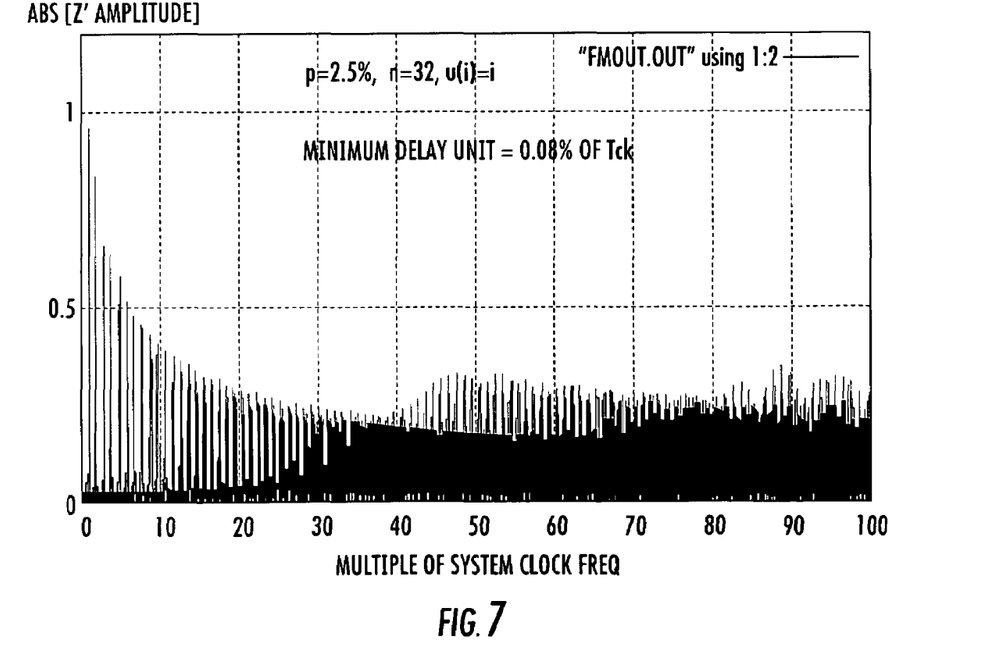
FIG. 7 shows a plot of function Z'(x) for p=2.5%, n=32 and u(i)=i in accordance with the present invention.

Similarly, a larger value of n for a given value of p provides better attenuation. An attenuation of 6 dB is achieved at the $15^{th}$ harmonic of the signal as shown in FIG. 6 for p=1% and n=32 as compared to the case with n=16 as shown in FIG. 4. Further, for p=2.5% and n=32 an attenuation of 6 dB is achieved at the $6^{th}$ harmonic of the signal. These observations are in agreement with frequency modulation theories [Communication Systems, by Simon Haykin, Wiley Eastern Limited, 1979]. The attenuation at lower harmonics is very low, as is visible up to the $8^{th}$ or $10^{th}$ harmonic. It is therefore necessary to know the frequency range for which the EMI is to be reduced before design.

Figure 8:
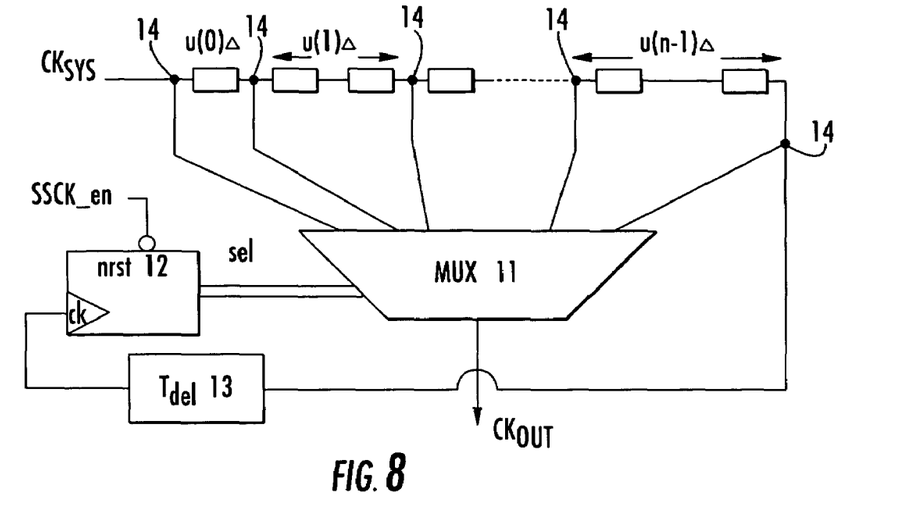
FIG. 8 shows a digital clock period modulator in accordance with the present invention.
Figure 9:
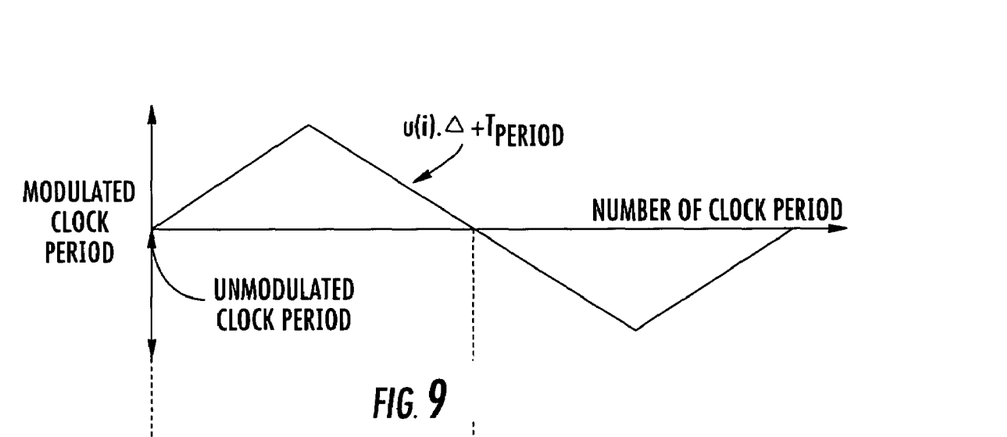
FIG. 9 shows one possible plot of time period variation in accordance with the present invention.
Figure 10:
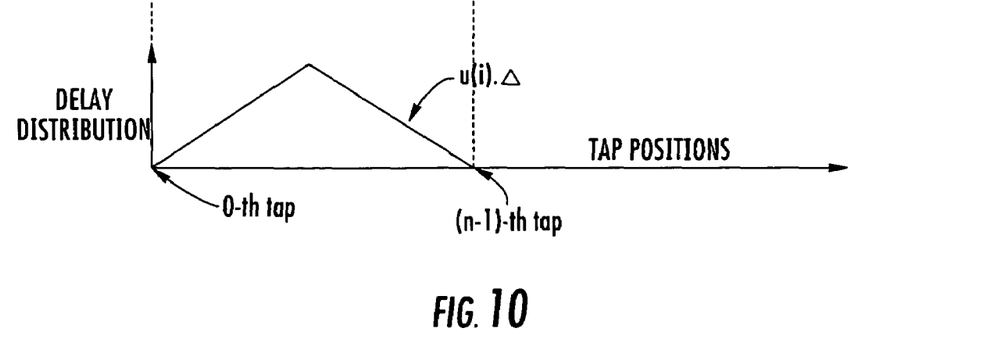
FIG. 10 shows a graph for the delay distribution in accordance with the present invention.

Circuits to perform time period modulation based upon the above mentioned principle will now be discussed. A preferred embodiment of the present invention is the circuit as shown in FIG. 8. This embodiment has a delay line comprising a chain of small delay elements, each of delay value $\Delta$, fed at the input by the system clock $CK_{in}$. The delay chain is tapped at different points 14 determined by the modulating wave's nature, as shown for example in FIG. 9. The delay segments distribution can be set to u(i)=i or any such function, and not necessarily linear as shown. The delay steps preferably are maximum at the middle of the chain while tapering off at the ends (shown as the delay distribution in FIG. 10) to provide a continuous curve modulating wave. The tapped delays are multiplexed at the output to produce a clock for the rest of the chip.

The multiplexer 11 is implemented by transmission gates or tri-state gates. The control of the multiplexer comes from state machine 12 which counts up from 0 to 'n' states, followed by down counting from 'n' to 0 again. The lower half of the modulating wave in FIG. 9, where the time period reduces from the unmodulated value, is achieved by the down counting of the state machine 12.

Glitch free operation of the circuit is ensured by providing the clock input of the state machine 12 through a predetermined delay element 13 which receives its input from the output of the last element of the delay chain. The predetermined delay element is selected so that when the multiplexer selects any input, the entire delay chain reflects the state of the clock waveform (either logic 0 or 1). When the state machine changes, controls to the multiplexer 11 may not change at the same time. There may be a switching back and forth for some of the inputs to the output before the control settles. By this time all the inputs to the multiplexer have the same settled value, and the output will not see a glitch. This is achieved by conforming to defined timing constraints. The value of the predetermined delay element 13 $T_{del}$ can be calculated pessimistically by the following relation:

$$\sum u(i) \cdot \Delta + T_{mux} + T_{del} + T_{CK \to Sel} < T_{HLmin} \qquad (9)$$

Where $T_{mux}$ is the maximum input to output delay in the multiplexer, $T_{CK>SEL}$ is the clock to output delay of the state-machine. $T_{HLmin}$ is the minimum of the high or low phase of the unmodulated system clock period and $\Sigma^{u(i) \cdot \Delta}$ is the total delay of the delay chain. The architecture can have an enable signal SSCK_en for enabling/disabling the modulation.

The choice of u(i), p and n of equation (8) depends on the minimum delay possible in the selected technology and the maximum deviation allowed in the system clock period. The delay element can comprise the minimum delay element available in the library or a finer delay element can be derived by available delay interpolation techniques. Quite often, larger variations (p) of clock periods is not allowed, so a modulating wave spanning over a larger number of clock cycles (n) would be preferred for better reduction of radiation, as it is evident from comparing FIG. 4 vs. 6 or FIG. 5 vs. 7. In this case a much finer delay element would be necessary. The technique to achieve this is discussed in the second embodiment.

Figure 11:
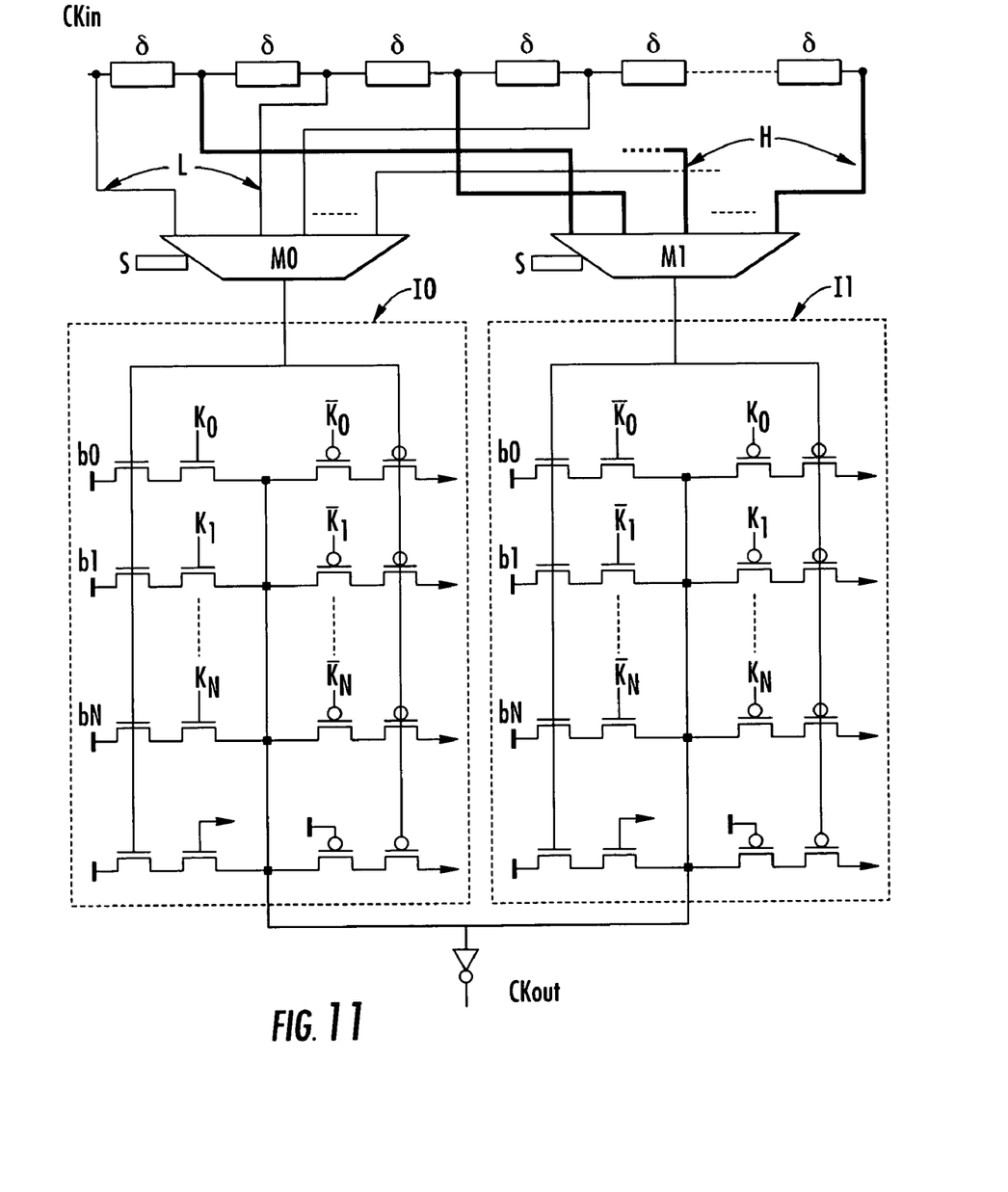
FIG. 11 shows another possible embodiment of the invention incorporating providing a finer modulation of the clock period.

A second embodiment of the invention for achieving finer delays than the library component by delay interpolation techniques is shown in FIG. 11. The delay elements δ are available delay units. Alternate taps (single line and double line taps) of the delay chain are fed to two multiplexers M0 and M1 which have the control signal-vector S.

The outputs of the multiplexers are the respective inputs to the delay interpolation block I0 and I1. The interpolation blocks are discussed in U.S. Pat. No. 6,169,436, which is assigned to the current assignee of the present invention and is incorporated herein by reference. Interpolation blocks will be explained for the sake of clarity and completeness. Only I0 and I1 comprise branches b0 to bN of series connected PMOS/NMOS transistors with a binary weighted width-to-length (W/L) ratio (b0 having the smallest), along with the control signal to turn on the branches $K_0 \ldots K_N$, and their complements. The control signals $K_i$s and their complements are connected to blocks I0 and I1, and for the same control code, if the I0 section of the interpolator is stronger with an increased number of branches on, then the I1 section will be weaker with less number of branches on, and vice-versa.

This way, an interpolation of delay between (i)δ and (i+1)δ is achieved. By interpolating the delay between two taps (i.e., δ), the delay is divided into $2^N$ possible finer delays. However, after obtaining the finely spaced delays, the control code is generated [S and $K_i/K_i'$] sequentially (from a lower to a higher code and backward) so that the delay from CKin to CKout meets the requirements of the u(i)Δ function of a smooth modulating waveform.

Figure 12:
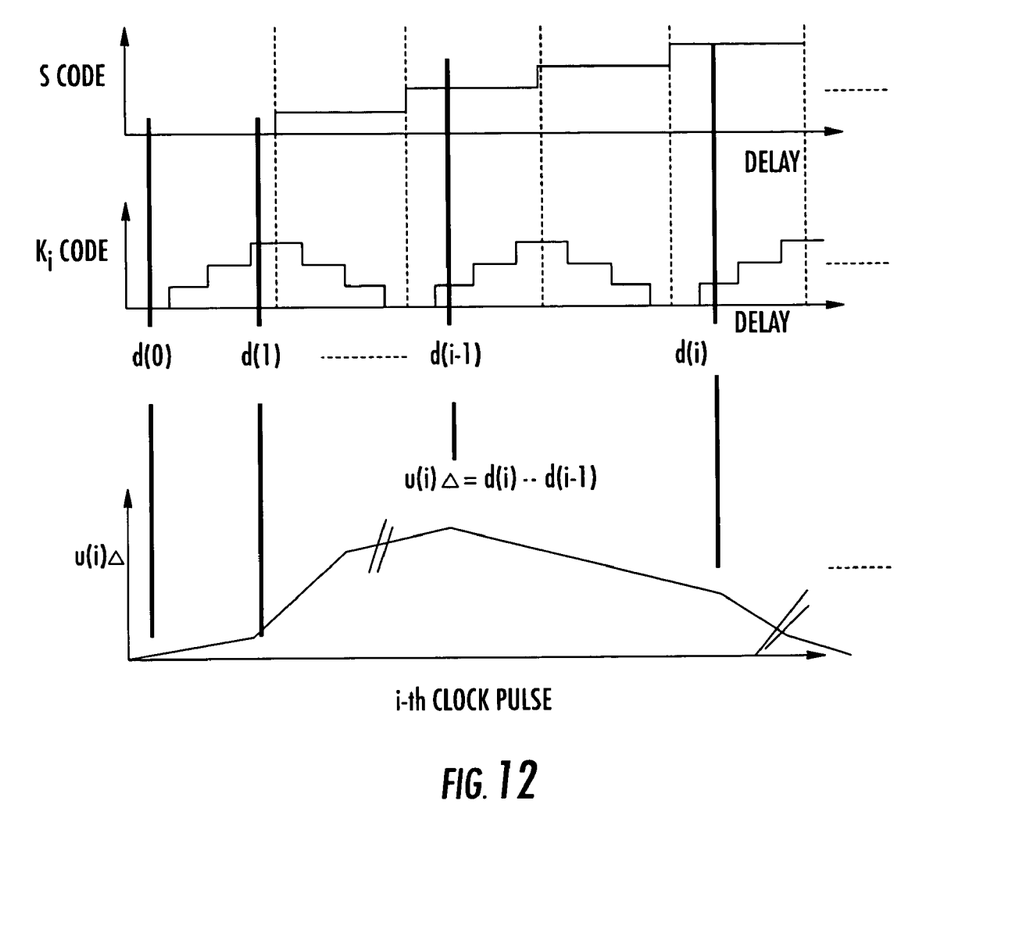
FIG. 12 shows a graph corresponding to a second embodiment of the invention for generating control signal and time period modulation.

FIG. 12 shows an example of an arbitrary delay variation using the second embodiment of the invention to achieve a smooth modulation of the clock period. The code for multiplexer selection (i.e., S) is shown as a monotonically increasing code (Y-axis) for increasing delay (X-axis) between Ckin to CKout, whereas the code for delay interpolation (i.e., $K_i$, Y-axis) is shown as increasing or decreasing for alternate codes of S, for increasing delay (X-axis). The delay variation pattern u(i)·Δ for the i-th clock pulse is determined by the difference of the delay between Ckin to Ckout in a previous clock pulse [d(i−1)] to the same delay during the present clock pulse [d(i)].

Discrete values of S and Ki are generated sequentially corresponding to required d(i)s for smooth time period modulation as shown in FIG. 12. This is a more suitable strategy for systems where the percentage variation of the clock period is small, yet there is a need to modulate over a larger number of clock cycles to achieve better attenuation in accordance with equation (8). A suitable delay is added before the clock reaches the control signal generator to avoid glitches.

It will be apparent to those with ordinary skill in the art that the foregoing is merely illustratively and is not intended to be exhaustive or limiting, having been presented by way of example only and wherein various modifications can be made within the scope of the invention.

Accordingly, this invention is not to be considered limited to the specific examples chosen for purposes of disclosure, but rather to cover all changes and modifications, which do not constitute departures from the permissible scope of the present invention. The invention is therefore not limited by the description contained herein or by the drawings.

That which is claimed is:

1. A digital clock modulator for providing a smoothly modulated clock period to reduce emitted-electro-magnetic radiation (EMR) comprising:

a plurality of delay elements coupled in series, and receiving as an input an unmodulated clock signal;

at least one multiplexer receiving inputs from unequally spaced taps between said plurality of delay elements;

the taps being spaced further apart from each other in a middle of said plurality of delay elements, and being spaced closer together at respective ends of said plurality of delay elements;

a control block providing selection inputs to said at least one multiplexer, and receiving the unmodulated clock signal from said plurality of delay elements; and said plurality of delay elements including a last delay element providing the unmodulated clock signal to said control block, said last delay element having a predetermined delay for ensuring that said plurality of delay elements and related signal paths are in a same stable state before control to said at least one multiplexer changes.

2. A digital clock modulator according to claim 1 wherein the taps are selected in accordance with a desired modulation of the unmodulated clock signal so that an output of said at least one multiplexer provides a modulated clock signal having a smoothly modulated clock period.

3. A digital clock modulator according to claim 1 wherein said control block comprises an up/down counter for sequentially selecting the taps so that a difference in delays of the unmodulated clock signal through said plurality of delay elements consecutively increases for consecutive clock cycles for one half of a modulating period and then reduces in a similar manner for a second half of the modulating period.

4. A digital clock modulator according to claim 1 wherein the predetermined delay of said last delay element is determined as follows:

$$\sum u(i) \cdot \Delta + T_{mux} + T_{del} + T_{CK \to Sel} < T_{HLmin}$$

where, $T_{mux}$ is a maximum input to output delay of said at least one multiplexer;

$T_{CK\text{->}SEL}$ is a clock signal to output delay of said control block;

$T_{HLmin}$ is a minimum of a high or low phase of an unmodulated clock cycle;

$T_{del}$ is a delay to be provided; and $\Sigma^{u(i) \cdot \Delta}$ is a total delay of said plurality of delay elements.

5. A digital clock modulator according to claim 1 further comprising a delay interpolator coupled to said at least one multiplexer for providing a finer resolution clock modulation over a larger number of clock cycles.

6. A digital clock modulator according to claim 5 wherein said at least one multiplexer comprises first and second multiplexers; and wherein the taps are coupled from said plurality of delay elements to said first and second multiplexers in an alternating fashion; and wherein said delay interpolator comprises:
  - a first chain of series coupled PMOS-NMOS transistor pairs coupled to an output of said first multiplexer;
  - a second chain of series coupled PMOS-NMOS transistor pairs coupled to an output of said second multiplexer; and
  - said PMOS-NMOS transistor pairs being sized such that their channel-length-to-channel-width ratios increase in a binary weighted sequence; and wherein the selection inputs provided by said control block comprises complementary control signals for said first and second multiplexers for enabling the series coupled PMOS-NMOS transistor pairs in a desired sequence.

7. A digital clock modulator according to claim 6 wherein a delay selection code for selecting one of said first and second multiplexers comprises a monotonically increasing code for increasing clock modulation depth, whereas a delay interpolator code for delay interpolation increases or decreases for alternate codes for said first and second multiplexers.

8. A digital clock modulator according to claim 7 wherein a modulating waveform is selected by sequencing the delay selection code and the delay interpolator code to provide consecutively increasing delays and differences in delays in a clock path for consecutive clock cycles over one half of a modulating period followed by similarly decreasing delays and differences in delays for a second half of the modulating period.

9. A digital clock modulator comprising:
  - a plurality of delay elements coupled in series, and receiving as an input an unmodulated clock signal;
  - at least one multiplexer receiving inputs from taps spaced between said plurality of delay elements;
  - a control block providing selection inputs to said at least one multiplexer;
  - a delay interpolator coupled to said at least one multiplexer for providing a finer resolution clock modulation over a larger number of clock cycles; and
  - said plurality of delay element including a last delay element providing the unmodulated clock signal to a clock terminal of said control block, said last delay element having a predetermined delay for ensuring that said plurality of delay elements are in a same state before control to said at least one multiplexer changes.

10. A digital clock modulator according to claim 9 wherein the taps are selected in accordance with a desired modulation of the unmodulated clock signal so that an output of said at least one multiplexer provides a modulated clock signal having a smoothly modulated clock period.

11. A digital clock modulator according to claim 9 wherein said control block comprises an up/down counter for sequentially selecting the taps so that a difference in delays of the unmodulated clock signal through said plurality of delay elements consecutively increases for consecutive clock cycles for one half of a modulating period and then reduces in a similar manner for a second half of the modulating period.

12. A digital clock modulator according to claim 9 wherein the taps are spaced further apart from each other in a middle of said plurality of delay elements, and are spaced closer together at respective ends of said plurality of delay elements.

13. A digital clock modulator according to claim 9 wherein the predetermined delay of said last delay element is determined as follows:

$$\sum u(i) \cdot \Delta + T_{mux} + T_{del} + T_{CK \to Sel} < T_{HLmin}$$

where, $T_{mux}$ is a maximum input to output delay of said at least one multiplexer;

$T_{CK\text{->}SEL}$ is a clock signal to output delay of said control block;

$T_{HLmin}$ is a minimum of a high or low phase of an unmodulated clock cycle;

$T_{del}$ is a delay to be provided; and $\Sigma^{u(i) \cdot \Delta}$ is a total delay of said plurality of delay elements.

14. A digital clock modulator according to claim 9 wherein said at least one multiplexer comprises first and second multiplexers; and wherein the taps are coupled from said plurality of delay elements to said first and second multiplexers in an alternating fashion; and wherein said delay interpolator comprises:
  - a first chain of series coupled PMOS-NMOS transistor pairs coupled to an output of said first multiplexer;
  - a second chain of series coupled PMOS-NMOS transistor pairs coupled to an output of said second multiplexer; and
  - said PMOS-NMOS transistor pairs being sized such that their channel-length-to-channel-width ratios increase in a binary weighted sequence; and wherein the selection inputs provided by said control block comprises complementary control signals for said first and second multiplexers for enabling the series coupled PMOS-NMOS transistor pairs in a desired sequence.

15. A digital clock modulator according to claim 14 wherein a delay selection code for selecting one of said first and second multiplexers comprises a monotonically increasing code for increasing clock modulation depth, whereas a delay interpolator code for delay interpolation increases or decreases for alternate codes for said first and second multiplexers.

16. A digital clock modulator according to claim 15 wherein a modulating waveform is selected by sequencing the delay selection code and the delay interpolator code to provide consecutively increasing delays and differences in delays in a clock path for consecutive clock cycles over one half of a modulating period followed by similarly decreasing delays and differences in delays for a second half of the modulating period.

17. A method for reducing emitted electro-magnetic radiation (EMR) from a digital clock modulator comprising:

providing an unmodulated clock signal as an input to a plurality of delay elements coupled in series;

providing outputs from unequally spaced taps between the plurality of delay elements to at least one multiplexer;

providing selection inputs from a control block to the at least one multiplexer based upon receiving the unmodulated clock signal;

the plurality of delay element including a last delay element for providing the unmodulated clock signal to the control block, the last delay element having a predetermined delay ensuring that the plurality of delay elements and related signal paths are in a same state before control to the at least one multiplexer changes; and a delay interpolator being coupled to the at least one multiplexer for providing a finer resolution clock modulation over a larger number of clock cycles.

18. A method according to claim 17 wherein the taps are selected in accordance with a desired modulation of the unmodulated clock signal so that an output of the at least one multiplexer provides a modulated clock signal having a smoothly modulated clock period.

19. A method according to claim 17 wherein the taps are selected so that a difference in delays of the unmodulated clock through the plurality of delay elements consecutively increases for consecutive clock cycles for one half of a modulating period and then reduces in a similar manner for a second half of the modulating period.

20. A method according to claim 17 wherein the predetermined delay of the last delay element is determined as follows:

$$\sum u(i) \cdot \Delta + T_{mux} + T_{del} + T_{CK \to Sel} < T_{HLmin}$$

where, $T_{mux}$ is a maximum input to output delay of the at least one multiplexer;

$T_{CK \to SEL}$ is a clock signal to output delay of the control block;

$T_{HLmin}$ is a minimum of a high or low phase of an unmodulated clock cycle;

$T_{del}$ is a delay to be provided; and $\sum u(i) \cdot \Delta$ is a total delay of the plurality of delay elements.

21. A method according to claim 17 wherein the at least one multiplexer comprises first and second multiplexers; and wherein the taps are coupled from the plurality of delay elements to the first and second multiplexers in an alternating fashion; and wherein the delay interpolator comprises:

a first chain of series coupled PMOS-NMOS transistor pairs coupled to an output of the first multiplexer;

a second chain of series coupled PMOS-NMOS transistor pairs coupled to an output of the second multiplexer; and the PMOS-NMOS transistor pairs being sized such that their channel-length-to-channel-width ratios increase in a binary weighted sequence; and wherein the selection inputs provided by the control block comprises complementary control signals for the first and second multiplexers for enabling the series coupled PMOS-NMOS transistor pairs in a desired sequence.

22. A method according to claim 21 wherein a delay selection code for selecting one of the first and second multiplexers comprises a monotonically increasing code for increasing clock modulation depth, whereas a delay interpolator code for delay interpolation increases or decreases for alternate codes for the first and second multiplexers.

* * * * *

UNITED STATES PATENT AND TRADEMARK OFFICE
CERTIFICATE OF CORRECTION

PATENT NO.       : 7,436,235 B2
APPLICATION NO.  : 10/909939
DATED            : October 14, 2008
INVENTOR(S)      : Tapas Nandy It is certified that error appears in the above-identified patent and that said Letters Patent is hereby corrected as shown below:

| | |
|---|---|
| Column 1, Line 16 | Delete: "neighboring, circuits"<br>Insert: --neighboring circuits-- |
| Column 3, Line 36 | Delete: " $\sum u(i) \cdot \Delta$ "<br>Insert: -- $\Sigma u(i) \cdot \Delta$ -- |
| Column 7, Line 17 | Delete: " $\sum u(i) \cdot \Delta$ "<br>Insert: -- $\Sigma u(i) \cdot \Delta$ -- |
| Column 9, Line 15 | Delete: " $\sum u(i) \cdot \Delta$ "<br>Insert: -- $\Sigma u(i) \cdot \Delta$ -- |
| Column 10, Line 36 | Delete: " $\sum u(i) \cdot \Delta$ "<br>Insert: -- $\Sigma u(i) \cdot \Delta$ -- |
| Column 12, Line 14 | Delete: " $\sum u(i) \cdot \Delta$ "<br>Insert: -- $\Sigma u(i) \cdot \Delta$ -- |

Signed and Sealed this

Twenty-third Day of December, 2008

JON W. DUDAS
*Director of the United States Patent and Trademark Office*